US012713823B2

(12) United States Patent
Eum et al.

(10) Patent No.: US 12,713,823 B2

(45) Date of Patent: Aug. 18, 2026

(54) FIXING DEVICE FOR DISPLAY MODULE AND DISPLAY DEVICE INCLUDING SAME

(71) Applicant: LG Display Co., Ltd., Seoul (KR)

(72) Inventors: Hyo-Sup Eum, Seoul (KR); HeeDong Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 459 days.

(21) Appl. No.: 18/476,756

(22) Filed: Sep. 28, 2023

(65) Prior Publication Data

US 2024/0215421 A1 Jun. 27, 2024

(30) Foreign Application Priority Data

Dec. 21, 2022 (KR) ........................ 10-2022-0180614

(51) Int. Cl.
*H10K 59/80* (2023.01)

(52) U.S. Cl.
CPC ......... *H10K 59/8794* (2023.02); *H10K 59/87* (2023.02)

(58) Field of Classification Search
CPC ........ H10K 50/84; H10K 50/87; H10K 59/87; H10K 59/8794; H05K 5/0017; F16B 2/14; G09F 9/30; G02F 1/133308
See application file for complete search history.

(56) References Cited

U.S. PATENT DOCUMENTS

2018/0027672 A1* 1/2018 Cho ..................... H05K 5/0234 361/697
2019/0159350 A1* 5/2019 Deng ..................... F16M 13/02
2024/0196553 A1* 6/2024 Zhang ...................... H05K 5/03

* cited by examiner

*Primary Examiner* — Peet Dhillon
(74) *Attorney, Agent, or Firm* — Fenwick & West LLP

(57) ABSTRACT

A display device includes a display module, a side frame supporting a portion of each of side portions of the display module, and at least one fixing unit fixing the display module to the side frame by pressing one surface of the display module on the side frame. The problem of peeling of an adhesive material due to high-temperature heat generated during operation of the display module is overcome by mechanically fitting components of the display module together.

19 Claims, 24 Drawing Sheets

FIXING DEVICE FOR DISPLAY MODULE AND DISPLAY DEVICE INCLUDING SAME

CROSS REFERENCE TO RELATED APPLICATION

This application claims priority from Republic of Korea Patent Application No. 10-2022-0180614, filed on Dec. 21, 2022, which is hereby incorporated by reference in its entirety.

BACKGROUND

Technical Field

Embodiments relate to a fixing device for a display module and a display device including the same.

Description of Related Art

Recently, along with the development of the information society and the development of a variety of portable electronic devices such as a mobile communication terminal and a notebook computer, the importance of display devices as visual information transmission media is ever increasing.

Among such display devices, a display device using organic light-emitting diodes (OLEDs) may include an organic light-emitting display panel (or an OLED display panel) on which a hole injection electrode (or anode), an organic emission layer, and an electron injection electrode (or cathode) are deposited and a back cover coupled to and supporting the organic light-emitting display panel. Here, the organic light-emitting display panel may emit light using energy generated when excitons generated by combining electrons and holes in the organic emission layer fall from the excited state to the ground state.

That is, the organic light-emitting display panel uses the principle that self-light emission is realized by sequentially stacking an anode layer, an organic material layer, and a cathode layer on a substrate and forming an appropriate energy difference in the organic material layer by applying a voltage to the anode layer and the cathode layer.

In this principle, the organic light-emitting display panel has a self-luminous property and does not require a separate light source unlike a liquid crystal display (LCD) panel. Thus, the thickness and weight of the organic light-emitting display panel may be reduced. In addition, the organic light-emitting display panel is regarded as the next generation display device for portable electronic devices, due to high-quality properties thereof such as low power consumption, high luminance, and a high response rate.

However, when an organic light-emitting display panel is driven for a long period of time, due to the above-described self-luminous property, the organic emission layer of the organic light-emitting display panel may be deteriorated by heat generated in the organic emission layer itself, thereby being denatured and decomposed. The deterioration problem may cause a deviation in luminance levels of pixels, thereby resulting in degradations in quality such as an afterimage and decreases in lifespan. In particular, the greater the area of the display panel, the more prominent these problems may be.

SUMMARY

In order to overcome the above-described problem of deterioration, a heat dissipation plate is provided between an organic light-emitting display panel and a back cover in order to dissipate high-temperature heat generated from the organic light-emitting display panel, and the heat dissipation plate is attached in position using adhesive tape.

However, this method has problems in that heat dissipation efficiency is low due to the tape located between the organic light-emitting display panel and the back cover and the tape may be peeled off by heat generated by the organic light-emitting display panel.

In this regard, the inventors of this specification invented a fixing device for a display module and a display device including the same, the fixing device being able to mechanically couple respective components of the display module without using an adhesive material such as tape.

Embodiments may provide a fixing device for a display module and a display device including the same, the fixing device being able to prevent or at least reduce a decrease in reliability due to peeling of the adhesive material since the adhesive material for fixing respective components of the display module is omitted.

Embodiments may provide a fixing device for a display module and a display device including the same, the fixing device having improved heat dissipation efficiency due to a heat dissipation plate in direct contact with an organic light-emitting display panel of the display module.

Embodiments may provide a display device including: a display module; a side frame supporting a portion of each of side portions of the display module; and at least one fixing unit fixing the display module to the side frame by pressing one surface of the display module on the side frame.

Embodiments may provide a fixing device of a display module, the fixing device including: a side frame supporting a portion of each of side portions of a display module; and at least one fixing unit fixing the display module to the side frame by pressing one surface of the display module on the side frame.

In the fixing device for a display module and the display device including the same according to embodiments, the fixing device may prevent or at least reduce a decrease in reliability due to peeling of the adhesive material since the adhesive material for fixing respective components of the display module is omitted.

In the fixing device for a display module and the display device including the same according to embodiments, the fixing device may have improved heat dissipation efficiency due to the heat dissipation plate in direct contact with the organic light-emitting display panel of the display module.

According to embodiments, the fixing device for a display module and the display device including the same may realize process optimization, since a process of attaching the adhesive material for fixing respective components of the display panel may be omitted.

BRIEF DESCRIPTION OF DRAWINGS

The above and other objectives, features, and advantages of the present disclosure will be more clearly understood from the following detailed description, taken in conjunction with the accompanying drawings, in which.

DETAILED DESCRIPTION

Figure 1:
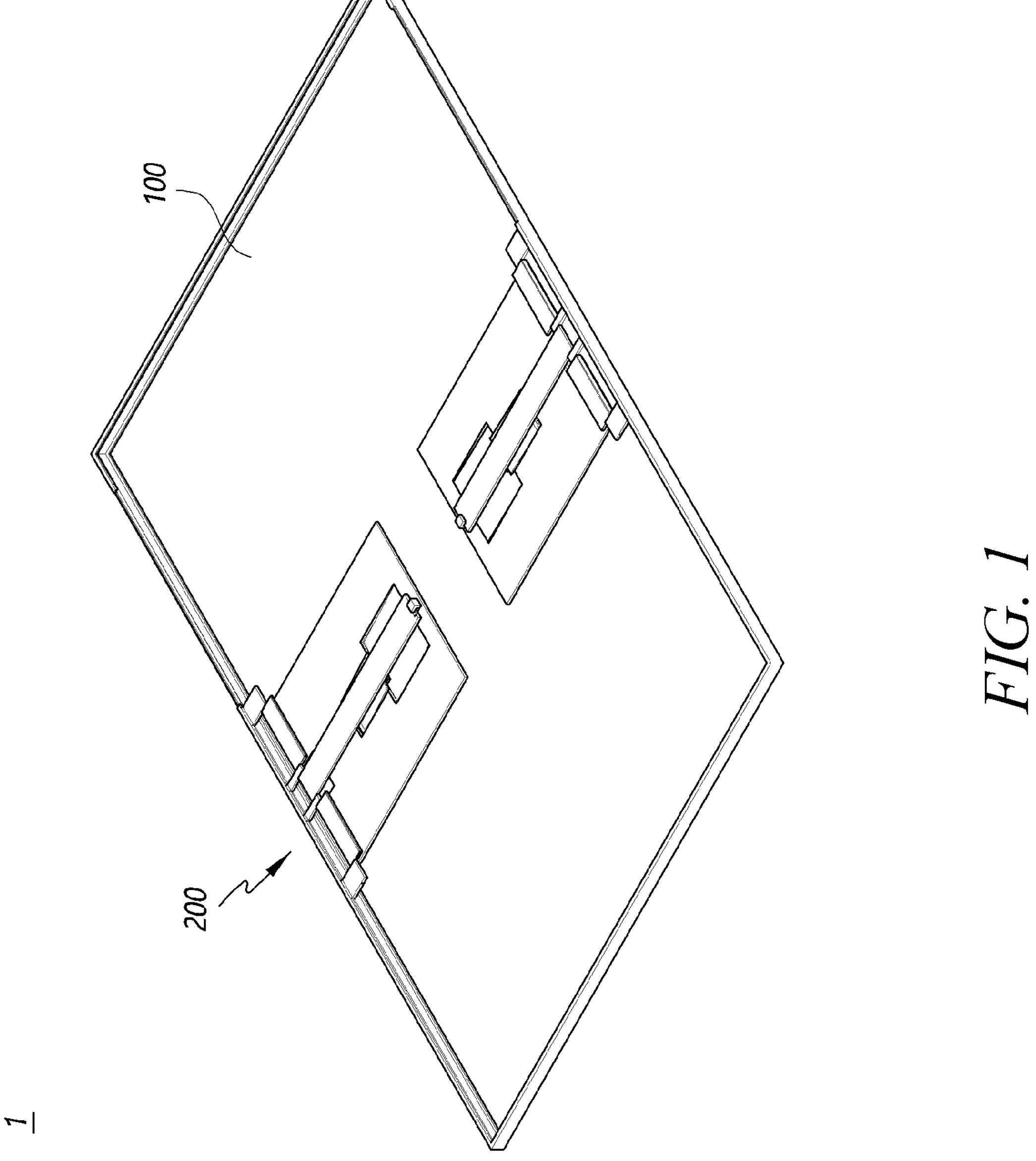
FIG. 1 is a perspective diagram illustrating a display device according to embodiments.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps", etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter a variety of embodiments of the present disclosure will be described in detail with reference to the accompanying drawings.

Figure 2:
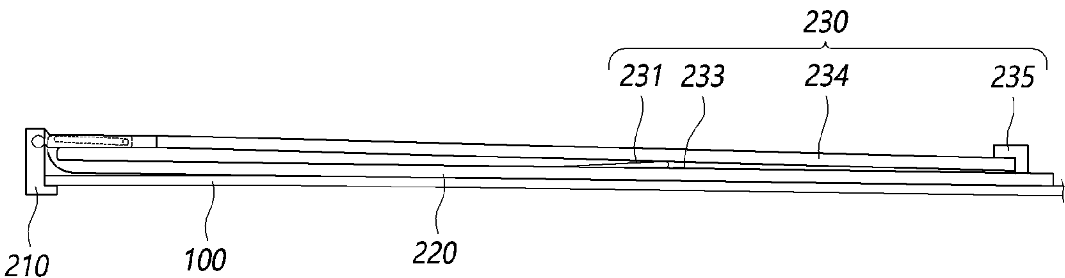
FIG. 2 is a side diagram of the display device illustrated in FIG. 1 according to embodiments.
Figure 3:
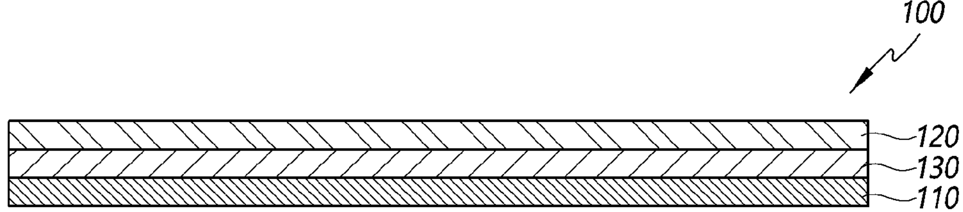
FIG. 3 is a cross-sectional diagram schematically illustrating the display device according to embodiments.

FIG. 1 is a perspective diagram illustrating a display device according to embodiments, FIG. 2 is a side diagram of the display device illustrated in FIG. 1, and FIG. 3 is a cross-sectional diagram schematically illustrating the display device according to embodiments.

Referring to FIGS. 1 to 3, the display device 1 according to embodiments may include a display module 100 and a fixing device 200.

The display module 100 may include an organic light-emitting display panel 110 and at least one of a back cover 120 covering one surface of the organic light-emitting display panel 110 and a heat dissipation plate 130 located between the organic light-emitting display panel 110 and the back cover 120. That is, the display module 100 may include the organic light-emitting display panel 110 as an essential component while selectively including the back cover 120 and the heat dissipation plate 130. For example, the display module 100 may include the organic light-emitting display panel 110 and the back cover 120. In some embodiments, the display module 100 may include the organic light-emitting display panel 110 and the heat dissipation plate 130. In some embodiments, the display module 100 may include all of the organic light-emitting display panel 110, the back cover 120, and the heat dissipation plate 130.

Hereinafter, for convenience of description, embodiments will be described on the assumption that a display surface of the organic light-emitting display panel 110 on which images are displayed faces downward in FIGS. 1 to 3.

The organic light-emitting display panel 110 is configured to display images, and may include an anode, a cathode, and organic compound layers HIL, HTL, EML, ETL, and EIL provided between the anode and the cathode. Here, the organic compound layers may include a hole injection layer (HIL), a hole transport layer (HTL), an emission layer (EML), an electron transport layer (ETL), and an electron injection layer (EIL). When a driving voltage is applied to the anode and the cathode, holes that have passed through the hole transport layer (HTL) and electrons that have passed through the electron transport layer (ETL) move to the emission layer (EML) to form excitons. As a result, the emission layer (EML) generates visible light. The organic light-emitting display panel 110 has self-luminous properties, and thus may also be referred to as a "self-luminous display panel".

The back cover 120 may cover one surface of the organic light-emitting display panel 110 opposite to the display surface on which images are displayed. This configuration of the back cover 120 may prevent or at least reduce any accidents such as foreign matter penetration to the organic light-emitting display panel 110 or damage to the organic light-emitting display panel 110 due to external shocks.

The heat dissipation plate 130 may be attached to one surface of the organic light-emitting display panel 110 to dissipate heat generated during driving of the organic light-emitting display panel 110. For example, the heat dissipation plate 130 may be a plate composed of Al having excellent heat dissipation efficiency. In addition, the heat dissipation plate 130 may be comprised of any material that may effectively dissipate heat generated by the organic light-emitting display panel 110.

The fixing device 200 may include a side frame 210, a fixing unit 220, and an anti-buckling unit 230.

The fixing device 200 according to embodiments may be used to mechanically fix the display module 100 on the side frame 210 without using an adhesive material such as tape.

Figure 4:
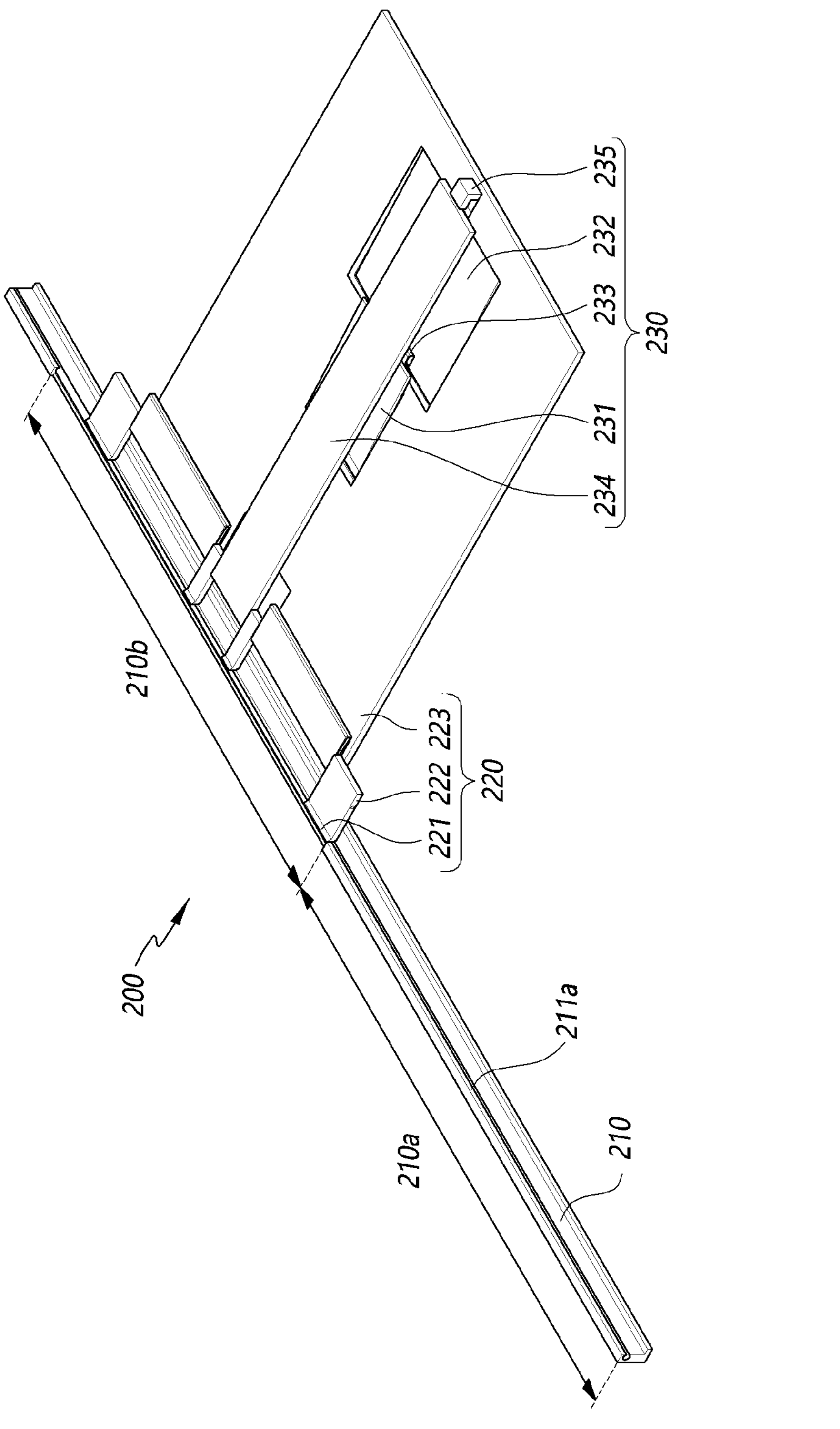
FIG. 4 is a perspective diagram of the fixing device included in the display device illustrated in FIG. 1 according to embodiments.
Figure 5:
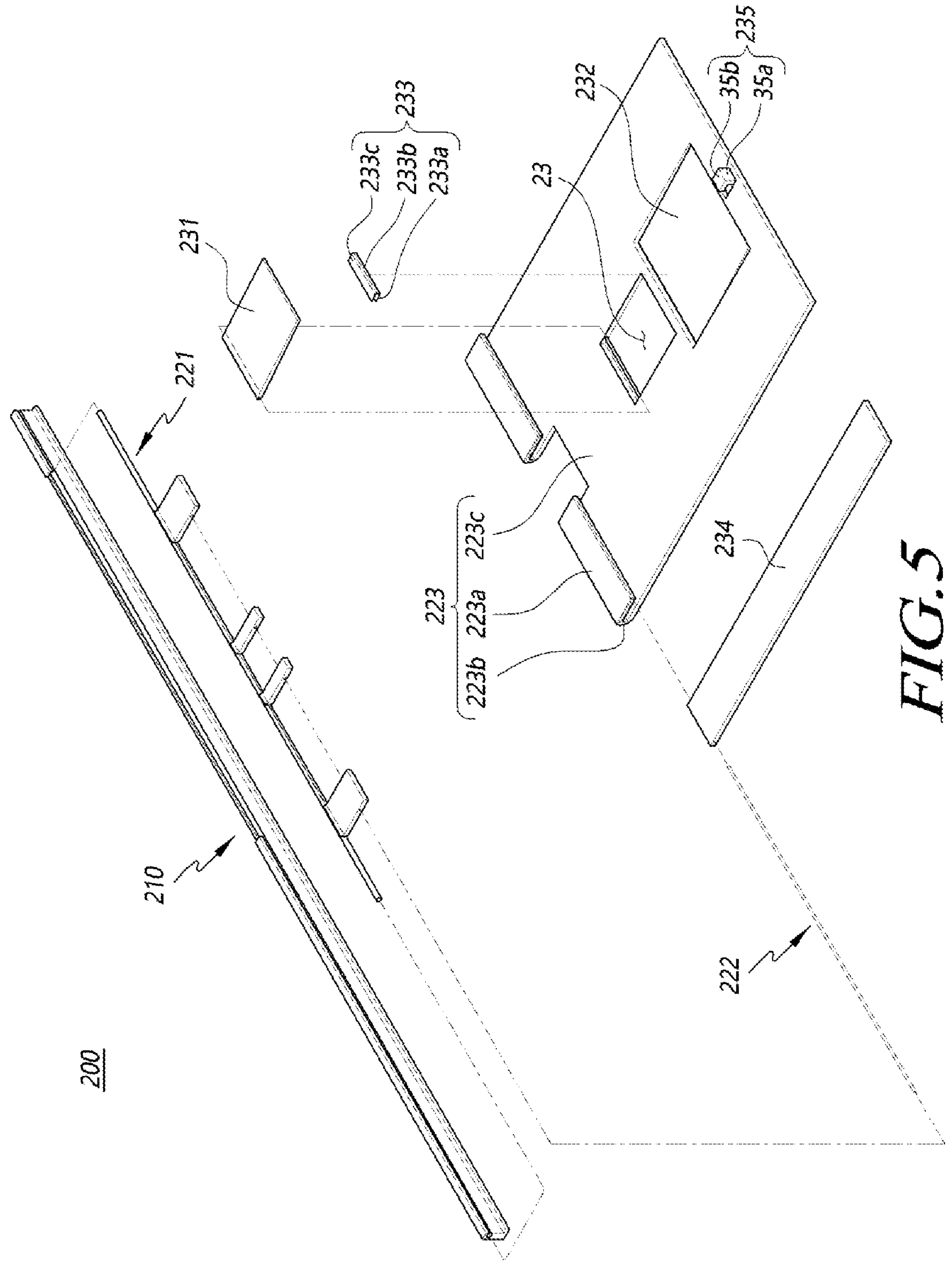
FIG. 5 is an exploded perspective diagram of the display device illustrated in FIG. 4 according to embodiments.

FIG. 4 is a perspective diagram of the fixing device included in the display device illustrated in FIG. 1, and FIG. 5 is an exploded perspective diagram of the display device illustrated in FIG. 4.

Referring to FIGS. 4 and 5, the side frame 210 forms edge surfaces of the display device 1. The side frame 210 may support respective portions of each of side portions of the display module 100 illustrated in FIG. 1. Although the side frame 210 according to embodiments is illustrated as having the shape of a plate elongated in one direction, the side frame 210 may have the shape of a rectangle having an open area therein (e.g., a symbol "□") to ultimately cover respective side portions of the display module 100. For example, the side frame 210 may be fabricated in the shape of a rectangle having an open area therein by a method of preparing four bars and connecting ends of the four bars to each other or a method of bending a bar elongated in one direction into the shape of the letter "C" (more particularly, in the shape of the Korean letter "ㄷ") having an open area and connecting a linear frame to both ends of the bent bar.

The side frame 210 may include a holding zone 210*a* for constraining the rotation of the fixing unit 220 according to the moved position and a release zone 210*b*.

The fixing unit 220 may fix the display module 100 to the side frame 210 by pressing one surface of the display module 100 on the side frame 210. For example, the fixing unit 220 may include a holder frame 221 coupled to the side frame 210, a holder rod 222 coupled to the holder frame 221, and a pressing member 223 coupled to the holder rod 222 to press one surface of the display module 100.

Due to this configuration, the fixing unit 220 may be configured to be rotatable or movable linearly on the side frame 210, and the rotation of the fixing unit 220 may be constrained according to the moved position. For example, when the fixing unit 220 is located in the holding zone 210*a*, the fixing unit 220 is constrained so as not to rotate upwards from the side frame 210. When the fixing unit 220 is located in the release zone 210*b*, the fixing unit 220 is constrained so as not to rotate upwards from the side frame 210.

When the rotation of the fixing unit 220 is constrained according to the moved position of the fixing unit 220, the display module 100 is not released from the side frame 210, with the bottom and a side portion of the display module 100 being fixed by the side frame 210 in FIGS. 4 and 5, and the upper portion of the display module 100 being fixed by the fixing unit 220.

When the display module 100 is fixed on the side frame 210 using the fixing unit 220 as described above, an adhesive material for attaching respective components of the display module 100 may be omitted. Thus, the problem of peeling of the adhesive material due to high-temperature heat generated during operation of the display module 100 may be overcome, thereby improving the reliability of a product. In addition, the heat dissipation plate 130 may be brought into direct contact with the organic light-emitting display panel 110 of the display module 100, whereby heat dissipation efficiency may be improved.

The number of the fixing units 220 may be determined depending on the size of the display module 100. That is, since the force of the fixing unit 220 for pressing the display module 100 may become increasingly insufficient with increases in the area of the display module 100, the number of the fixing units 220 may be selectively increased or reduced depending on the size of the display module 100.

The anti-buckling unit 230 may be configured to press the central portion of the fixing unit 220 toward the display module 100 so that the central portion of the fixing unit 220 presses the display module 100. Specifically, the anti-buckling unit 230 includes a guide link 231, an elastic member 232, a backup member 233, a locking member 234, and a holder 235. The central portion of the fixing unit 220 may be pressed downwards in FIGS. 4 and 5, and a detailed description thereof will be given later.

Figure 6:
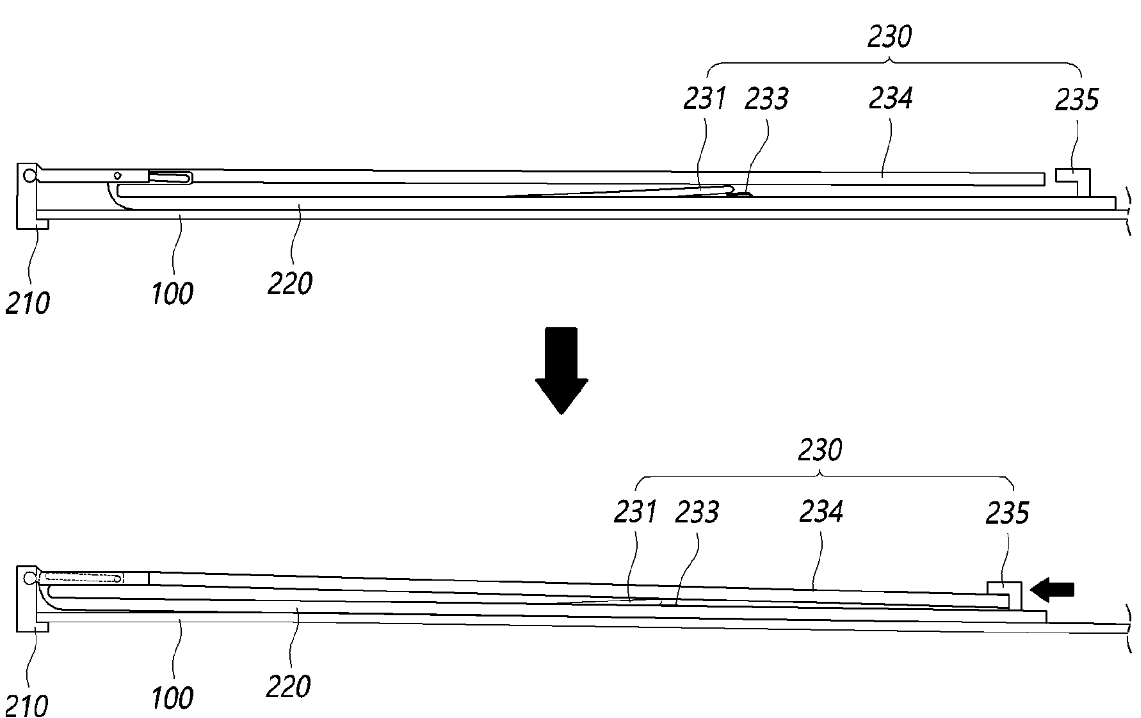
FIG. 6 is a side diagram schematically illustrating a process of fixing the display module using the fixing device according to embodiments.

FIG. 6 is a side diagram schematically illustrating a process of fixing the display module using the fixing device according to embodiments.

Referring to FIG. 6, in a state in which the display module 100 is fixed to the side frame 210, the fixing unit 220 may move in the direction of (i.e., toward) the side frame 210 along an upward incline on the display module 100 so as to press one surface of the display module 100.

That is, before the display module 100 is pressed, the side portion and a portion of the bottom of the display module 100 are supported by the side frame 210 in FIG. 6. In this position, when the fixing unit 220 located above the display module 100 is moved upwards from the display module 100 in the direction of the side frame 210, i.e., in the direction from right to left in FIG. 6, a distal end of the fixing unit 220 presses the display module 100 downwards. When pressed in this manner, the fixing unit 220 may be constrained between the side frame 210 and the display module 100, and the display module 100 may be fixed on the side frame 210 by this constraining force.

Figure 7:
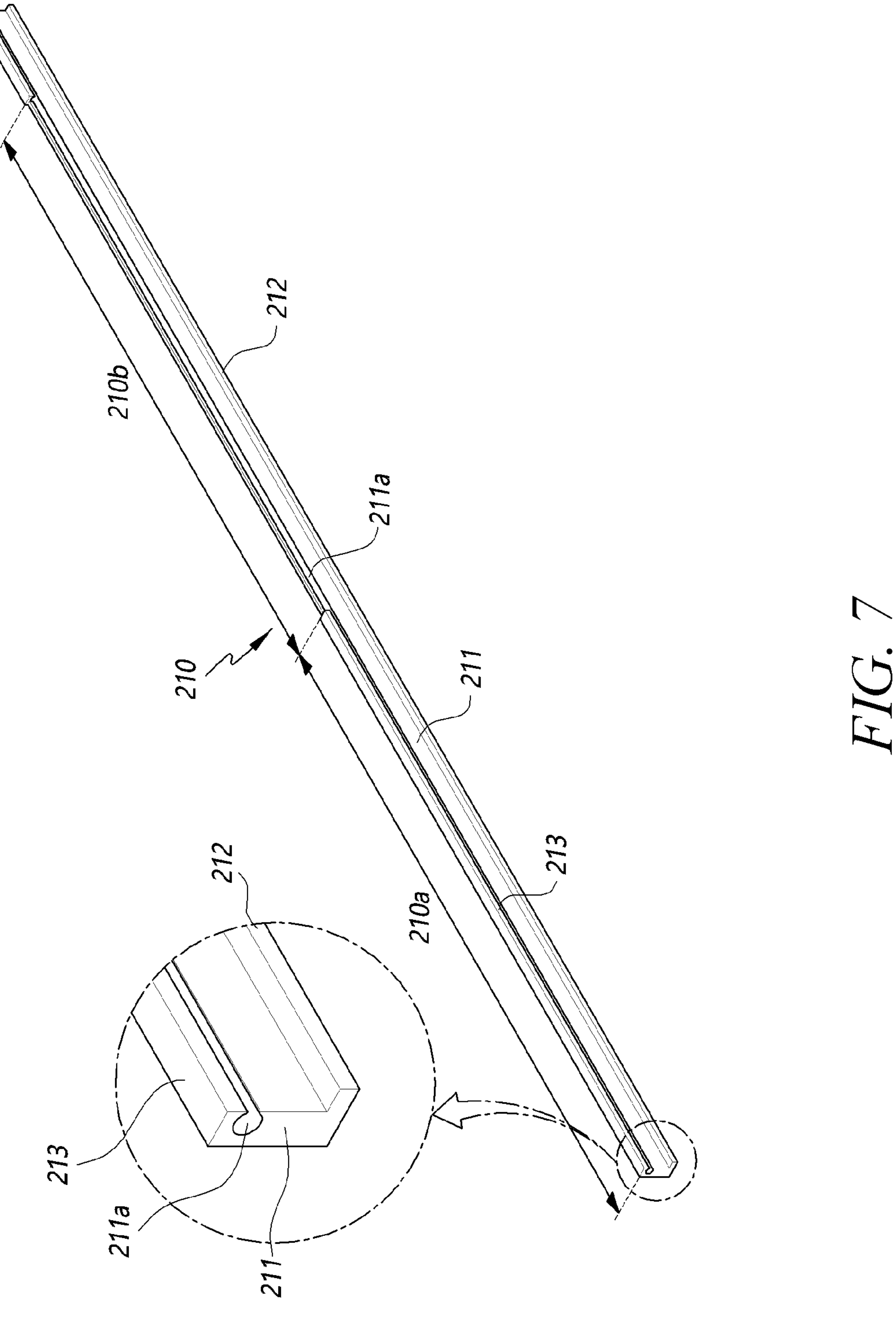
FIG. 7 is a perspective diagram illustrating the side frame according to embodiments.

FIG. 7 is a perspective diagram illustrating the side frame according to embodiments.

Referring to FIG. 7, the side frame 210 may include a first frame 211, a second frame 212, and an anti-rotation portion 213.

The first frame 211 covers a side surface of the display module 100. The first frame 211 may have a rail groove 211*a* formed in a surface facing the display module 100 to be elongated in the longitudinal direction.

The second frame 212 covers a portion of the display surface of the display module 100 on which images are displayed. The second frame 212 may extend from one end of the first frame 211 in the direction of the display module 100.

The anti-rotation portion 213 is configured to constrain the rotation of the fixing unit 220 according to the moved position. The anti-rotation portion 213 may partially protrude from the side frame 210 according to the direction of the display module 100. For example, a plurality of anti-rotation portions 213 may be disposed on the other end of the first frame 211 to be spaced apart from each other. The protruding ends of the anti-rotation portions 213 may be inclined downward in the direction of the display module 100.

Since the anti-rotation portions 213 are provided on the side frame 210 in this manner, the side frame 210 may include the holding zone 210*a* in which the anti-rotation portions 213 are located and the release zone 210*b* provided between the anti-rotation portions 213. Due to this configuration, when the fixing unit 220 is located in the release zone 210*b*, the fixing unit 220 may rotate in the direction away from the display module 100. When the fixing unit 220 is located in the holding zone 210*a*, the fixing unit 220 may interfere with the anti-rotation portion 213 so that the rotation thereof may be constrained.

Figure 8:
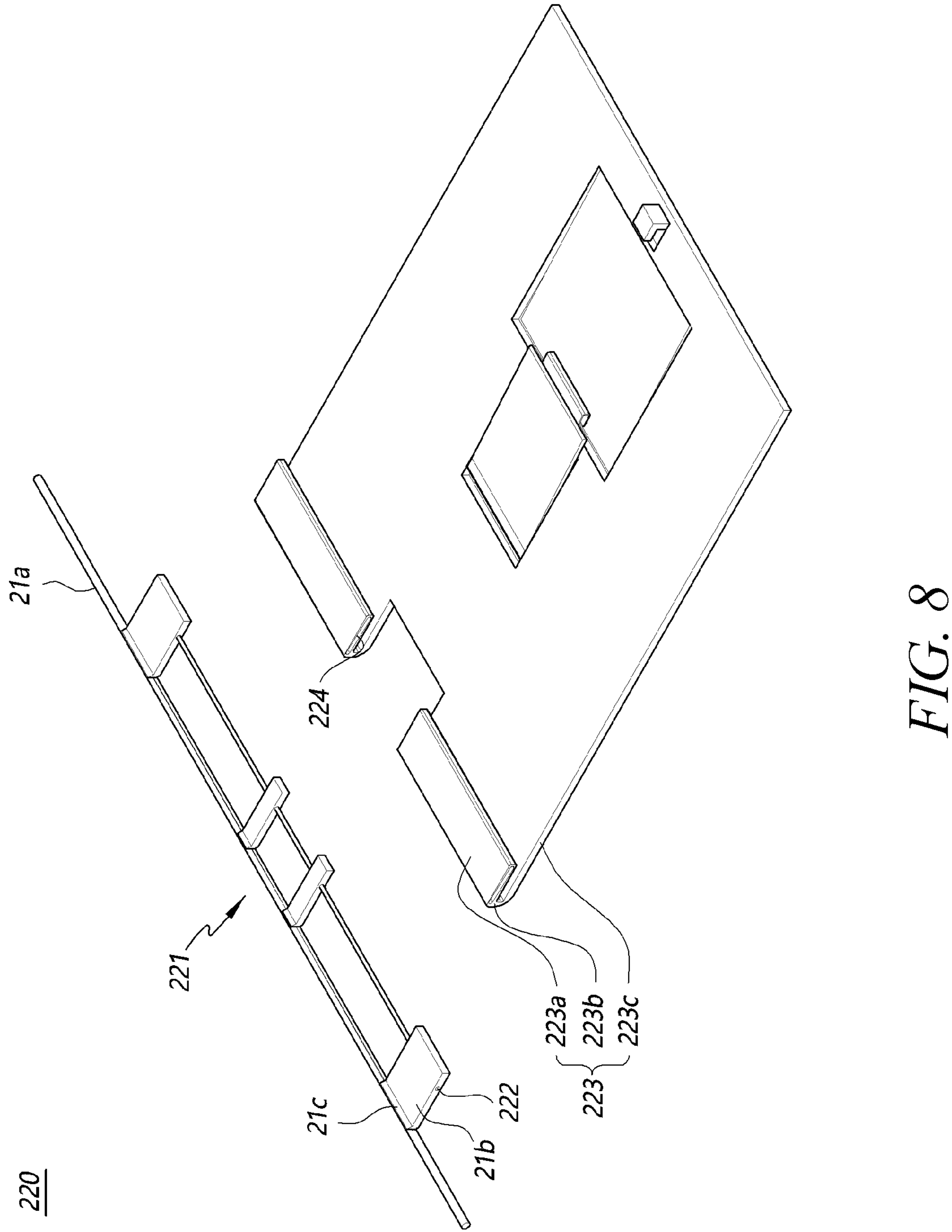
FIG. 8 is an exploded perspective diagram of the fixing unit according to embodiments.

FIG. 8 is an exploded perspective diagram of the fixing unit according to embodiments.

The structure of the fixing unit 220 described with reference to FIGS. 4 and 5 will be described in detail with reference to FIG. 8.

Referring to FIG. 8, the fixing unit 220 may include the holder frame 221, the holder rod 222, and the pressing member 223.

The holder frame 221 may be sliding coupled to the rail groove 211*a* of the side frame 210.

Figure 9:
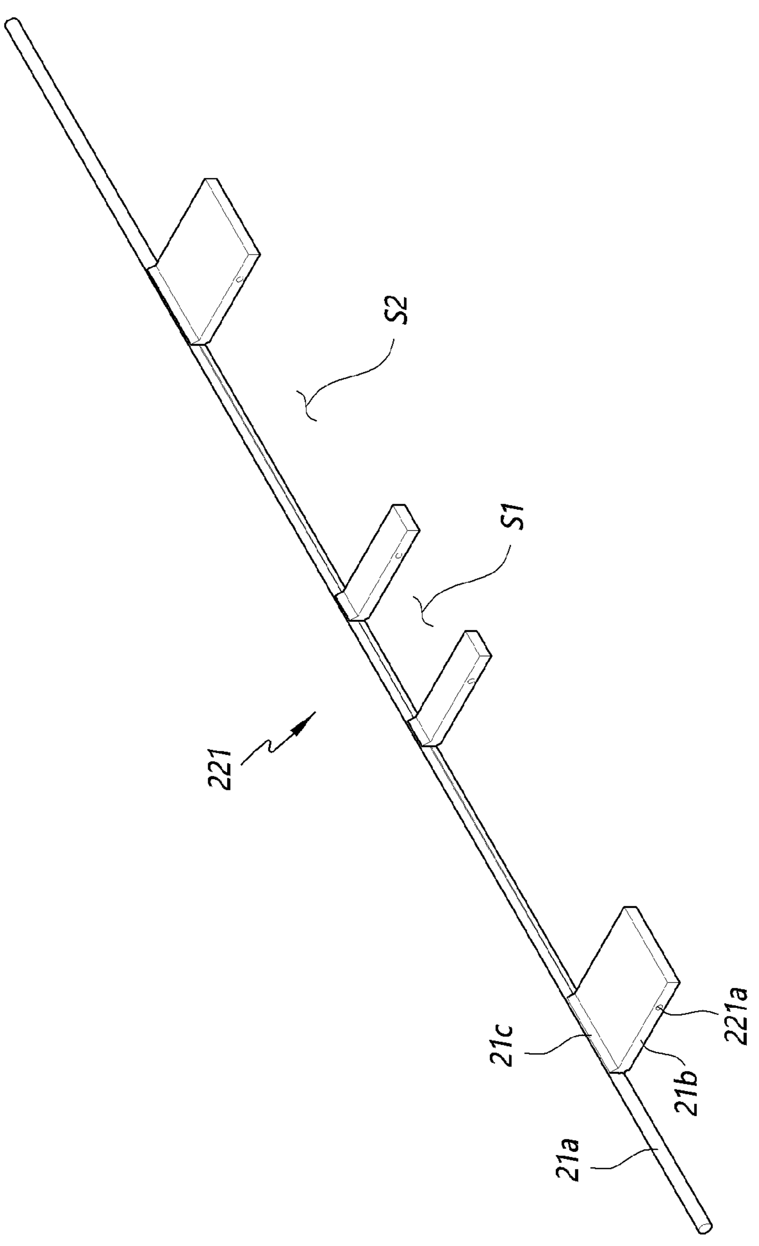
FIG. 9 is a perspective view of the holder frame illustrated in FIG. 8 according to embodiments.
Figure 9:

FIG. 9 is a perspective view of the holder frame illustrated in FIG. 8. Referring to FIGS. 8 and 9, the holder frame 221 may include a rod 21*a*, extension plates 21*b*, and constraining plates 21*c*. A through-hole 221*a* may be formed to extend through side portions of the extension plates 21*b* in the longitudinal direction of the holder frame 221.

The rod 21*a* may be coupled to the longitudinal rail groove 211*a* of the side frame 210 so as to be rotatable and movable. For example, the rod 21*a* may have the shape of a cylinder elongated in one direction. The rod 21*a* may move linearly from the rail groove 211*a* formed in one surface of the side frame 210 and rotate in a direction perpendicular to the direction in which the rod 21*a* moves linearly.

A plurality of extension plates 21*b* may extend from side portions of the rod 21*a* in one direction and be spaced apart from each other. For example, a total of four extension plates 21*b* may be provided, with a first pair of extension plates being disposed at the center to be spaced apart from each other, and a second pair of extension plates being disposed outside and spaced apart from the first pair of extension plates. Thus, a first coupling space S1, in which one side of a locking member 234 to be described later may be located, may be provided in the central portion, and second coupling spaces S2 in each of which one side of the corresponding part 223 may be located may be provided on both sides of the first coupling space S1.

Each of the constraining plates 21*c* protrudes from one surface of the corresponding extension plate 21*b* adjacent to the rod 21*a* in the direction away from a position at which the display module 100 is located. The constraining plate 21*c* may interfere with a portion of the side frame 210 depending on the state of rotation or movement of the rod 21*a* so as to constrain the rotation of the rod 21*a*.

For example, in a state in which the display module 100 is coupled to the side frame 210, when the constraining plates 21*c* are located in the release zone 210*b*, the rod 21*a* is free to move linearly and to rotate in the direction away from the position of the display module 100. When the constraining plates 21*c* are located in the holding zone 210*a*, the constraining plates 21*c* interfere with portions of the side frame 210 and thus are not able to rotate further. That is, when the fixing unit 220 is located in the holding zone 210*a*, downward movement of the fixing unit 220 in FIGS. 8 and 9 is constrained by the extension plates 21*b* and upward movement of the fixing unit 220 in FIGS. 8 and 9 is constrained by the constraining plates 21*c*.

Figure 10:
FIG. 10 is a perspective diagram schematically illustrating a state in which the holder frame is coupled to the side frame according to embodiments.
Figure 10:
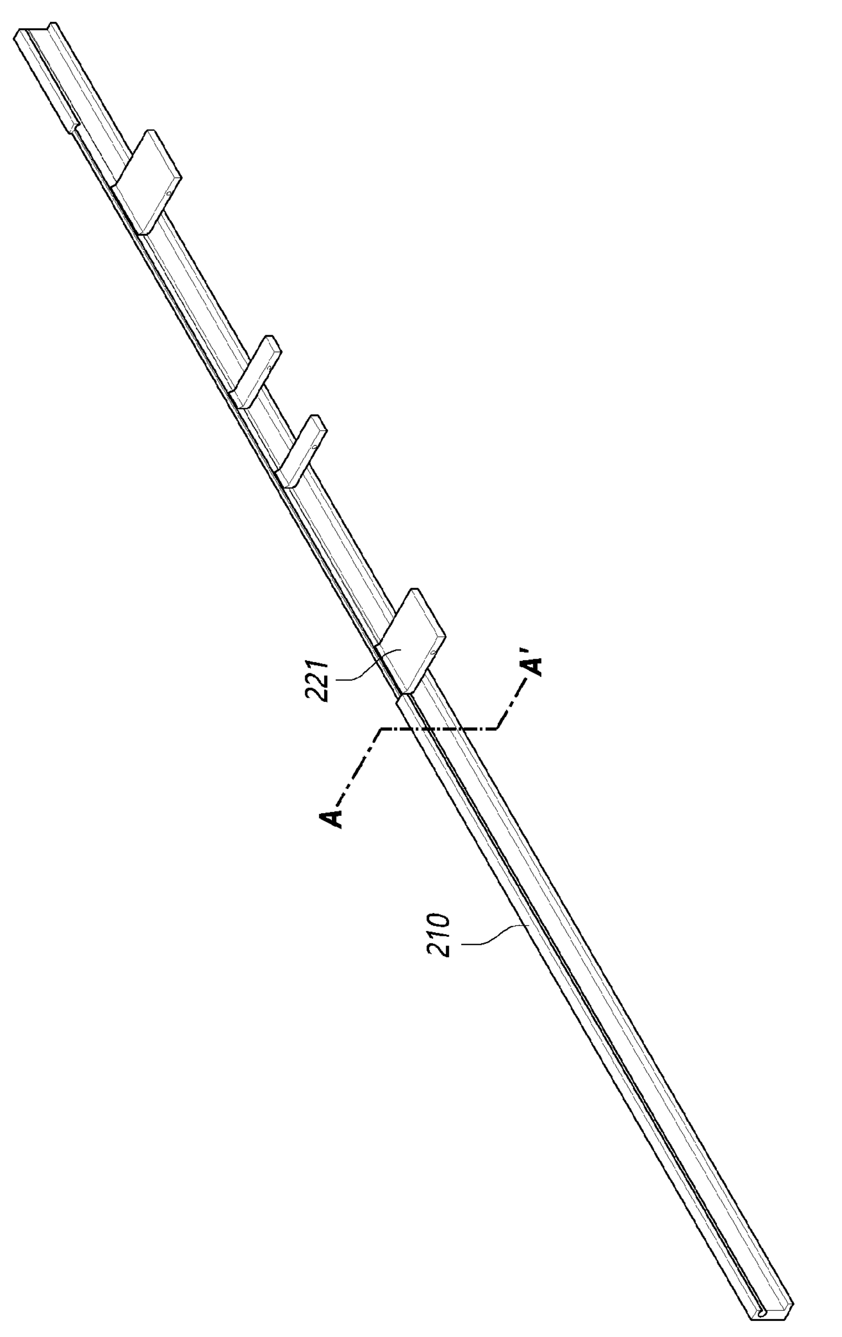
Figure 11:
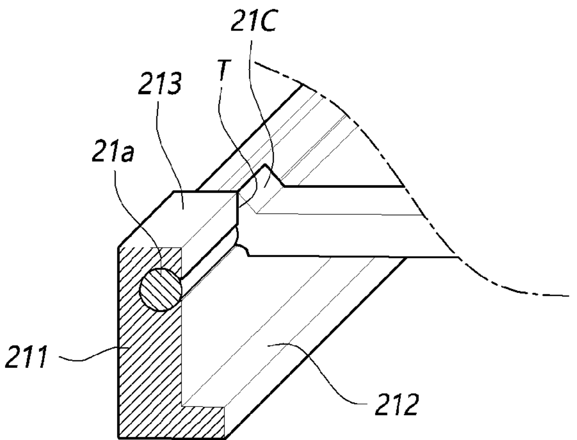
FIG. 11 is a cross-sectional diagram taken along line A-A' in FIG. 10 according to embodiments.

FIG. 10 is a perspective diagram schematically illustrating a state in which the holder frame is coupled to the side frame, and FIG. 11 is a cross-sectional diagram taken along line A-A' in FIG. 10.

Since the holder frame 221 is separated from the side frame 210, the force for supporting the display module 100 may be smaller than that of an integral structure. Thus, as illustrated in FIG. 11, contact surfaces of the anti-rotation portion 213 and the constraining plates 21*c* may be formed as inclined surfaces T, respectively, in order to increase support force between the holder frame 221 and the side frame 210.

For example, each of the contact surfaces of the anti-rotation portion 213 and the constraining plates 21*c* may have a tapered shape inclined downward in the direction of the display module 100. That is, the inclined surfaces T having the tapered shape may increase the contact area between the anti-rotation portion 213 and the constraining plates 21*c*, thereby increasing the force for supporting the display module 100. In addition, the extension plates 21*b* and the fixing unit 220 may be moved toward the display module 100 along the inclined surface T in order to press the display module 100. The angle of each of the inclined surfaces T may be in the range of 3° to 10°. When the angle of the inclined surface T is narrower than 3°, it is difficult to obtain a sufficient support area. When the angle of the inclined surface T is wider than 10°, the side frame 210 may be damaged.

The holder rod 222 may be coupled to through-holes 221*a* of the holder frame 221. Due to this configuration of the holder rod 222, the pressing member 223 and the locking member 234 to be described below may be pivotably coupled to the holder frame 221.

Figure 12:
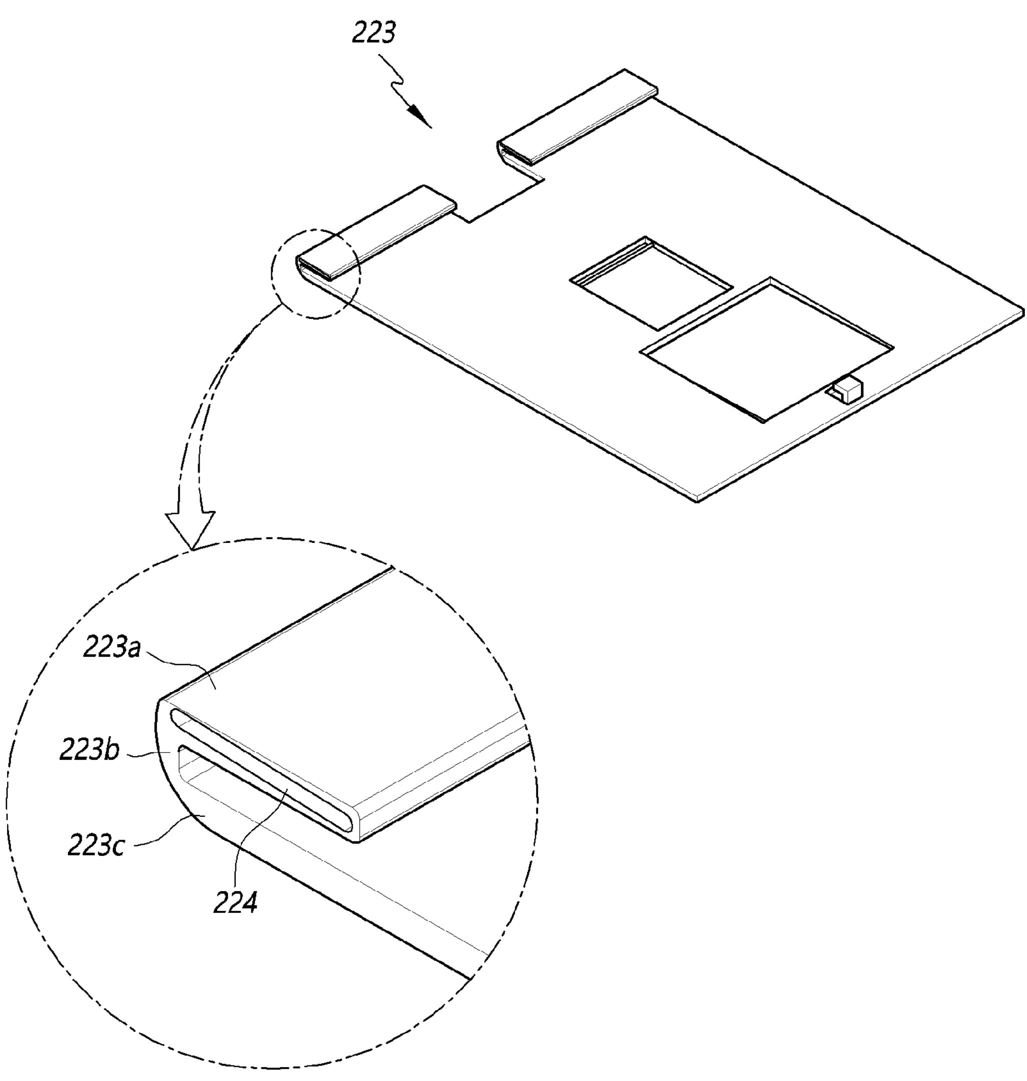
FIG. 12 is a perspective diagram of the pressing member illustrated in FIG. 8 according to embodiments.

FIG. 12 is a perspective diagram of the pressing member 223 illustrated in FIG. 8.

Referring to FIGS. 8 and 12, guide holes 224 may extend through a side portion of the pressing member 223. The pressing member 223 may be movably coupled to the holder frame 221 by means of the holder rod 222 inserted into the guide holes 224 to press one surface of the display module 100.

The cross-section of each of the guide holes 224 formed in the side portion of the pressing member 223 may have the shape of a slit elongated from the side frame 210 toward the display module 100. In addition, the cross-section of each of guide holes 224 may be inclined downward from the side frame 210 in the direction of the display module 100. Thus, in a state in which the display module 100 is coupled to the side frame 210, when the pressing member 223 is moved toward the side frame 210 along the guide holes 224, a distal portion of the pressing member 223 presses one surface of the display module 100 so that the display module 100 may be fixed between the side frame 210 and the pressing member 223.

Specifically, the pressing member 223 may include coupling portions 223*a*, extension portions 223*b*, and a pressing plate 223*c*.

The coupling portions 223*a* has the guide holes 224 extending through side portions thereof. The holder rod 222 may be coupled to the coupling portions 223*a* through the guide holes 224. Thus, when external force is applied to the pressing member 223, the holder rod 222 may move along the inclination of the guide holes 224 formed in the coupling portions 223*a*.

The extension portions 223*b* may extend from predetermined ends (i.e., proximal ends) of the coupling portions 223*a* in the direction of the display module 100. That is, the extension portions 223*b* may be disposed to face the first frame 211.

The pressing plate 223*c* extends perpendicularly from extended ends of the extension portions 223*b*. The pressing plate 223*c* may selectively press the display module 100 in response to changes in position. That is, when the pressing member 223 moves toward the side frame 210 along the inclination of the guide holes 224 in response to external force applied to the pressing member 223, one end of the pressing plate 223*c* may move downwards toward the display module 100 to press one surface of the display module 100.

Figure 13:
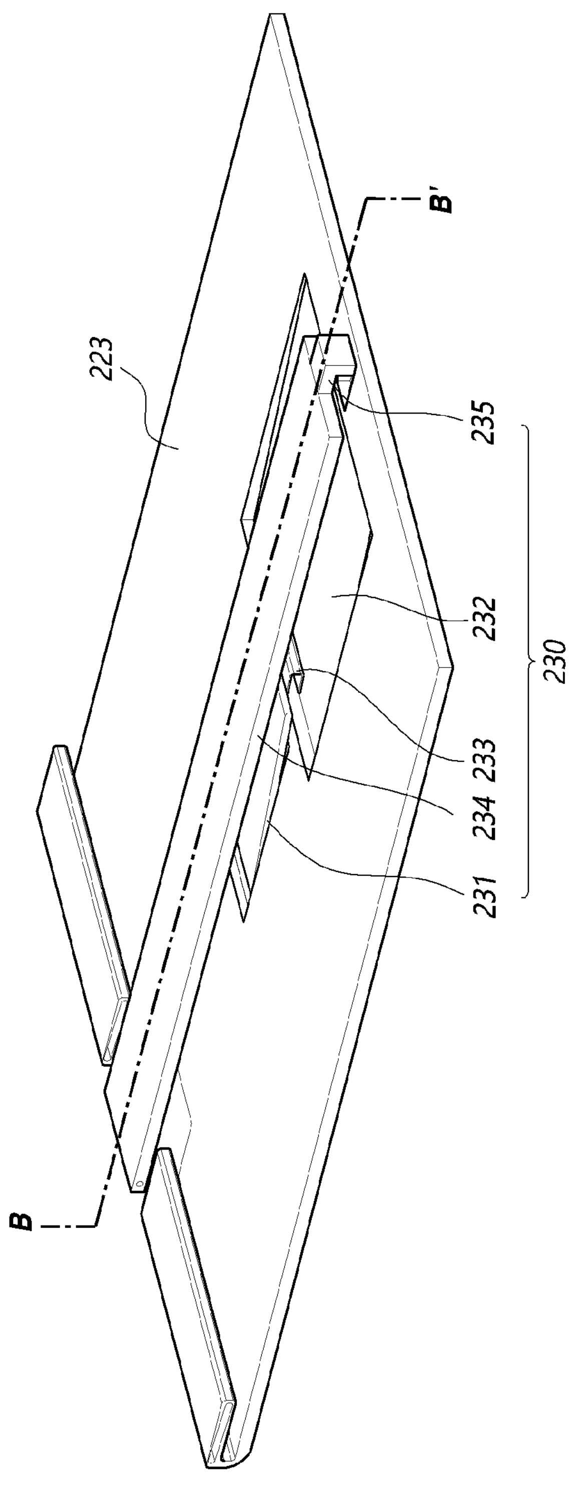
FIG. 13 is a perspective diagram illustrating the anti-buckling unit according to embodiments.
Figure 14:
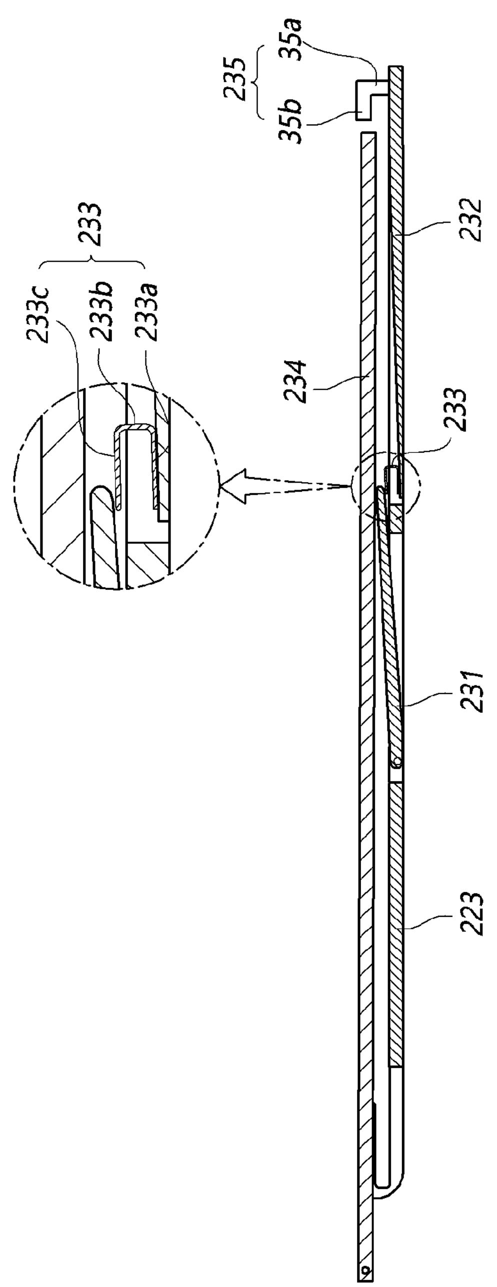
FIG. 14 is a cross-sectional diagram taken along line B-B' in FIG. 13 according to embodiments.

FIG. 13 is a perspective diagram illustrating the anti-buckling unit according to embodiments, and FIG. 14 is a cross-sectional diagram taken along line B-B' in FIG. 13.

With reference to FIGS. 13 and 14, the above-described anti-buckling unit 230 will be described in detail as follows.

The anti-buckling unit 230 may be configured to press the central portion of the fixing unit 220 toward the display module 100 so that the central portion of the fixing unit 220 presses the display module 100.

Specifically, the anti-buckling unit 230 may include the guide link 231, the elastic member 232, the backup member 233, the locking member 234, and the holder 235.

The guide link 231 may be hinge-coupled to the central portion of the fixing unit 220. For example, after an open area 23 is formed by cutting a portion of the central portion of the pressing plate 223*c* (see FIG. 5), one side of the guide link 231 may be hinge-coupled to the open area 23 so that the other side thereof is rotatable.

The elastic member 232 is disposed to face the guide link 231 on the fixing unit 220. The elastic member 232 may move in the direction of the display module 100 when external force is applied and return to the original position when external force is removed.

For example, the elastic member 232 may be formed by cutting a portion of the fixing unit 220, and may have the shape of a plate including a free end facing the guide link 231 and a fixed end located at the other side of the free end. Specifically, one end of the elastic member 232 may be formed as a free end and the other end of the elastic member 232 may be formed as a fixed end by cutting the fixing unit 220 into the shape of the letter "C" (more particularly, in the shape of the Korean letter "ㄷ"). The elastic member 232 may be configured such that the thickness gradually decreases in the direction from the fixed end to the free end. Thus, when external force is applied to the free end, deformation and restoration may be facilitated.

The backup member 233 may elastically support the other side of the guide link 231 on the elastic member 232. For example, the backup member 233 may include a fixed plate 233*a*, a perpendicular plate 233*b*, and a support plate 233*c*.

The fixed plate 233*a* may be fixed to one surface of the elastic member 232 and extend from the guide link 231 in the direction of the holder 235. For example, the fixed plate 233*a* may be fixed to the free end side of the elastic member 232.

The perpendicular plate 233*b* may extend perpendicularly from the extended end of the fixing unit 220.

The support plate 233*c* may extend perpendicularly from the extended end of the perpendicular plate 233*b* in the direction of the side frame 210 and be disposed to face the fixed plate 233*a* to support a portion of the guide link 231.

Due to this structure of the fixed plate 233*a*, the perpendicular plate 233*b*, and the support plate 233*c*, the backup member 233 may be provided in the shape of the letter "C" (more particularly, in the shape of the Korean letter "ㄷ") to elastically support the other side of the guide link 231. Although the backup member 233 has been described and illustrated as having the shape of the letter "C" in the present embodiment, the backup member 233 may have a variety of other elastically deformable structures.

The locking member 234 may be configured such that one side thereof is rotatable with respect to the side frame 210 and a portion of the other side is supported on the guide link 231. For example, the locking member 234 may have the shape of a bar elongated in one direction. In a state in which one side of the locking member 234 is located in the first coupling space S1, the locking member 234 may be rotatably coupled by means of the holder rod 222.

The holder 235 is provided on one surface of the fixing unit 220. When the fixing unit 220 is moving toward the side frame 210 in order to press one surface of the display module 100, the holder 235 may constrain the other side of the locking member 234. For example, the holder 235 may be provided on the pressing plate 223*c*. When the pressing member 223 is moving toward the side frame 210 along the guide holes 224, the holder 235 may constrain the locking member 234 by surrounding the other side of the locking member 234 while moving toward the side frame 210 together with the pressing plate 223*c*. Here, the guide link 231 and the backup member 233 are disposed below the central portion of the locking member 234 to apply pressure upwards, and thus the locking member 234 is not released from the holder 235.

The holder 235 may include a first protruding portion 35*a* and a second protruding portion 35*b*.

The first protruding portion 35*a* may protrude perpendicularly from one surface of the other side of the fixing unit 220. In addition, the second protruding portion 35*b* may protrude from the protruding end of the first protruding portion in the direction of the locking member 234. Here, the protruding length of the first protruding portion 35*a* may be determined to be greater than the thickness of the locking member 234 and be smaller than a sum of the thicknesses of the guide link 231, the backup member 233, and the locking member 234. This is because when the protruding length of the first protruding portion 35*a* is smaller than the thickness of the locking member 234, it is difficult to couple the locking member 234 to the holder 235. In addition, when the protruding length of the first protruding portion 35*a* is greater than the sum of the thicknesses of the guide link 231, the backup member 233, and the locking member 234, it is difficult to press the display module 100 by means of the elastic member 232.

Since the fixing device 200 is provided with the anti-buckling unit 230 as described above, not only the distal end of the fixing device 200 but also the central portion of the fixing device 200 may press the display module 100 downwards, thereby fixing the display module 100. Thus, deformations in the display module 100 caused by thermal expansion or vibrations may be reduced so that the display module 100 may be used more reliably.

Figure 15A:
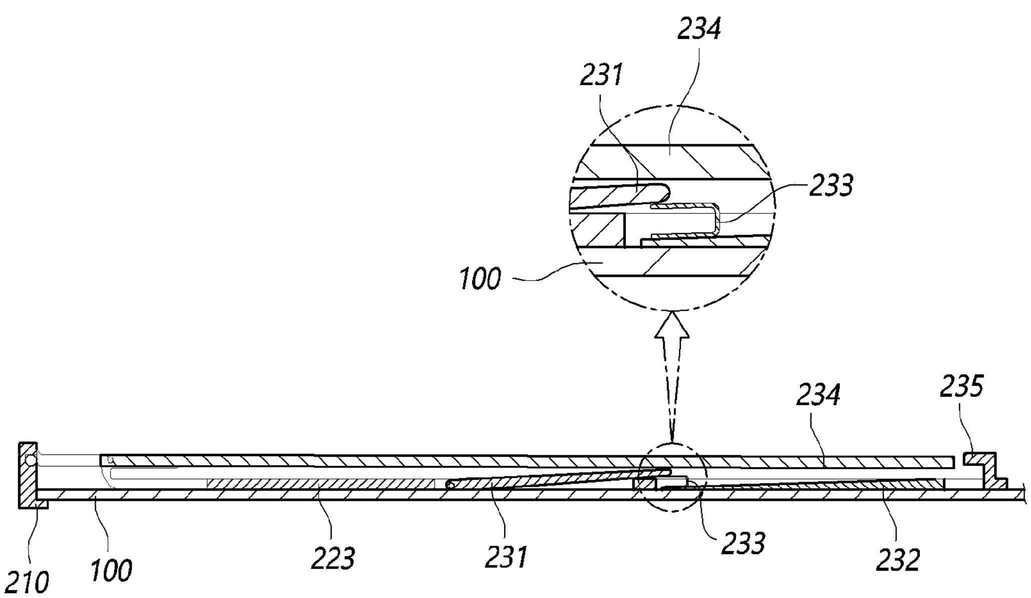
FIGS. 15A and 15B are cross-sectional diagrams schematically illustrating the states of the display module according to the position of the anti-buckling unit according to embodiments.
Figure 15B:
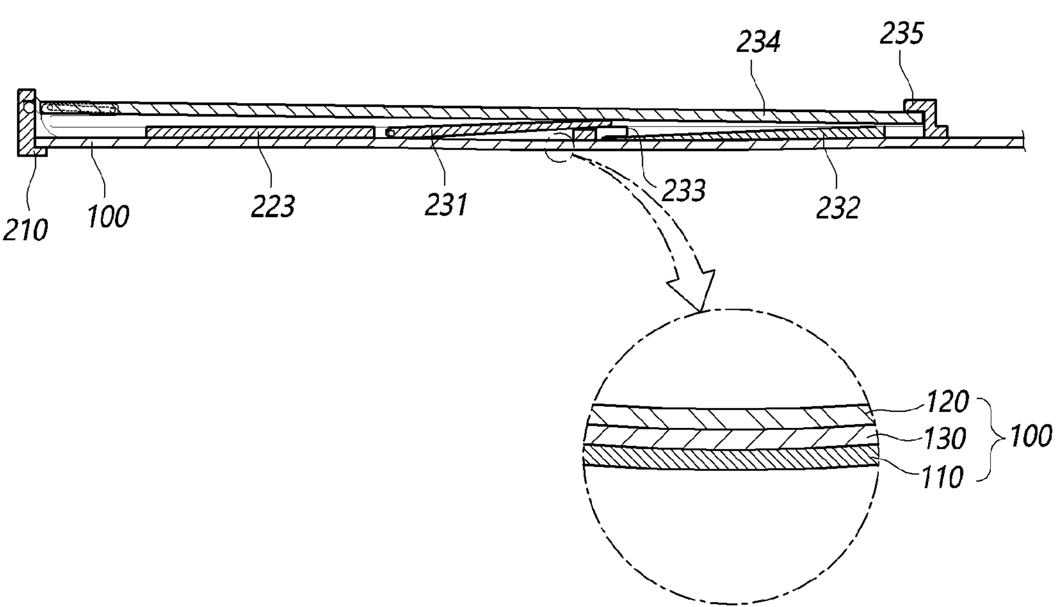

FIGS. 15A and 15B are cross-sectional diagrams schematically illustrating the states of the display module according to the position of the anti-buckling unit.

Specifically, FIG. 15A illustrates the state in which the holder 235 of the anti-buckling unit 230 is not coupled to the locking member 234, and FIG. 15B illustrates the state in which the holder 235 of the anti-buckling unit 230 is coupled to the locking member 234.

As illustrated in FIGS. 15A and 15B, when the holder 235 of the anti-buckling unit 230 is coupled to the locking member 234, the pressing member 223 moves toward the side frame 210 along the inclination of the guide holes 224 formed in the side portions. That is, the pressing member 223 may move upward in the direction from the right to the left in FIGS. 15A and 15B, and may be coupled to the locking member 234 by means of the holder 235.

Thus, the locking member 234 presses the guide link 231, the elastic member 232, and the backup member 233 downwards. Not only the distal portion of the display module 100 but also the central portion of the display module 100 may be pressed by this pressing force.

In addition, as illustrated in FIG. 15B, after the fixing of the display module 100 using the fixing unit 220 and the anti-buckling unit 230 is completed, the pressing member 223 and the locking member 234 may have a three-section link structure. Since the three-section link structure is fixed and does not move in a non-rotating situation, the display module 100 may be more firmly fixed on the side frame 210.

FIGS. 16A to 16D are perspective diagrams schematically illustrating a process of fixing a display device according to embodiments.

With reference to FIGS. 16A to 16D, the process of fixing the display module 100 using the fixing device 200 will be briefly described as follows. In embodiments, for convenience of description, the fixing device 200 will be illustrated and described as being disposed only on one side of the display module 100.

Figure 16A:
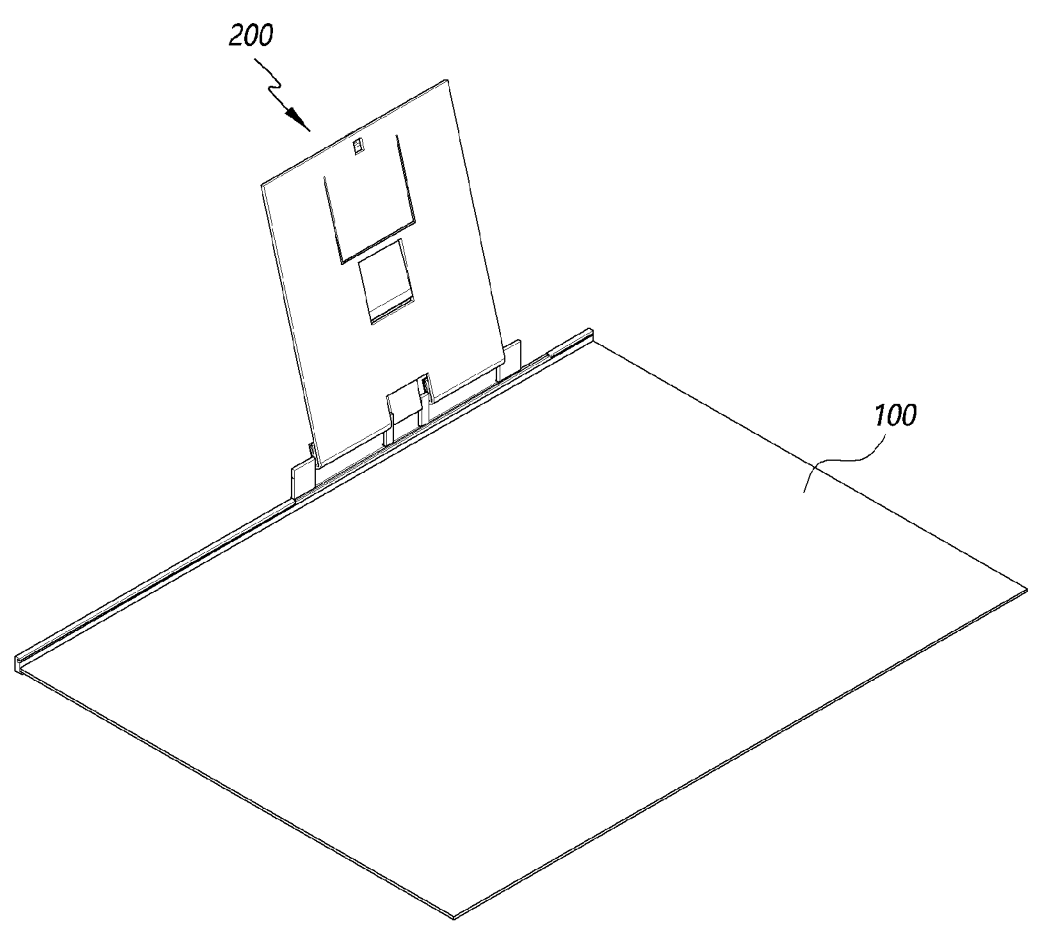
FIGS. 16A to 16D are perspective diagrams schematically illustrating a process of fixing a display device according to embodiments.

First, as illustrated in FIG. 16A, in a state in which the fixing unit 220 is seated in the release zone 210*b* of the side frame 210, one surface of the side frame 210 is opened by rotating the fixing unit 220, thereby forming a space in the side frame 210 into which the display module 100 may be inserted.

Figure 16B:
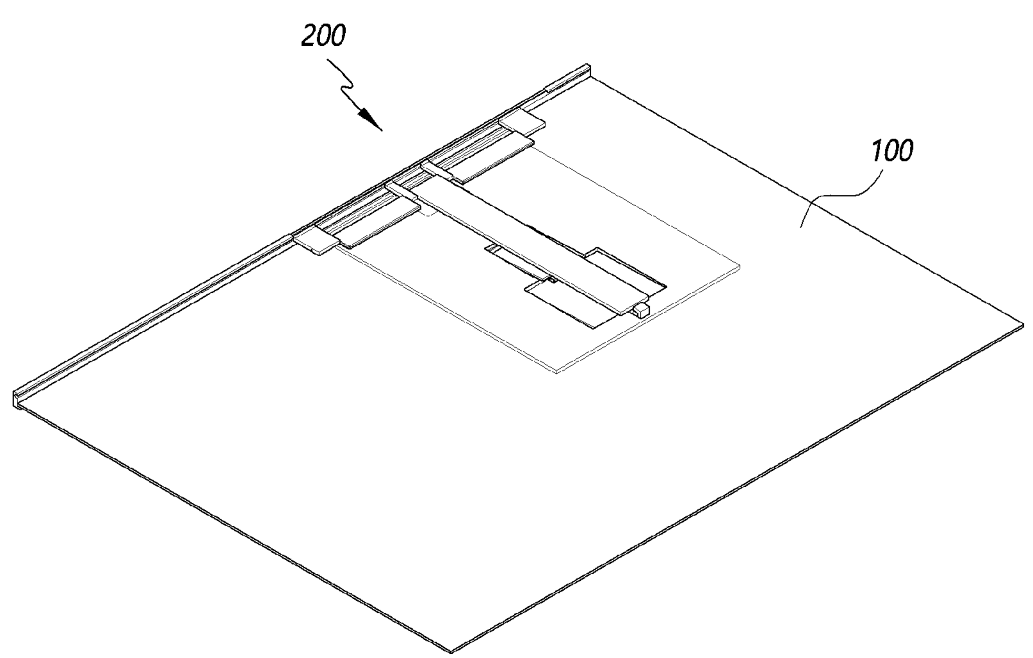
Figure 16C:
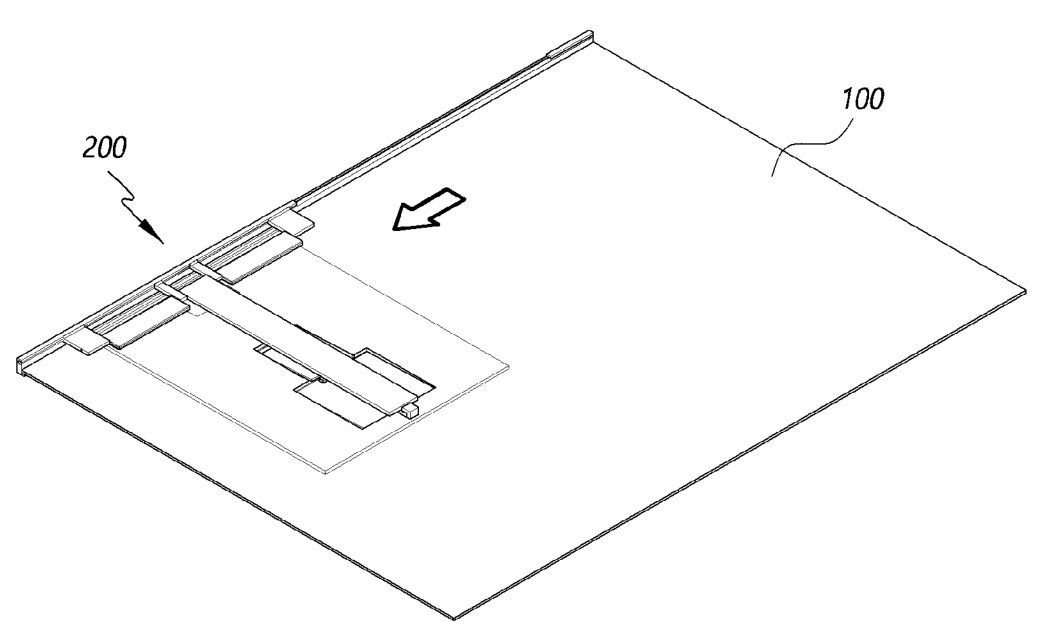

Afterwards, as illustrated in FIG. 16B, the fixing unit 220 is rotated toward the display module 100. Afterwards, as illustrated in FIG. 16C, the fixing unit 220 is moved linearly toward the holding zone 210*a* of the side frame 210. As a result, the constraining plates 21*c* of the fixing unit 220 interfere with the anti-rotation portion 213 of the side frame 210, such that further rotation is prevented or at least reduced.

Figure 16D:
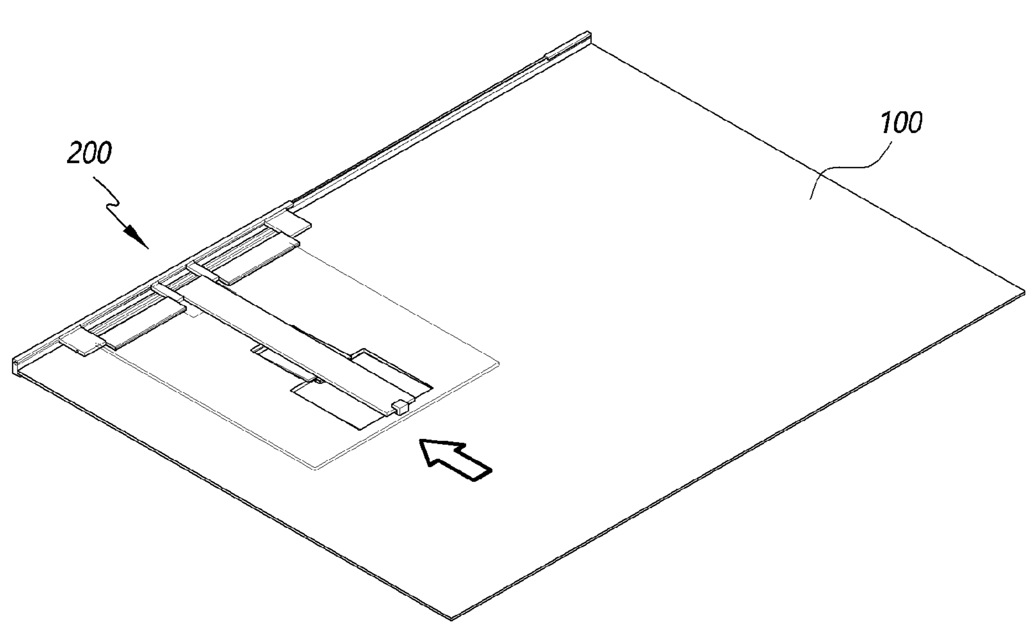

In this state, as illustrated in FIG. 16D, when the fixing unit 220 is moved toward the side frame 210, the fixing unit 220 moves along the inclination of the guide holes 224. As a result, the distal end of the fixing unit 220 presses the display module 100 while rotating and moving upwards toward the display module 100. Due to this pressing force, the display module 100 may be fixed between the side frame 210 and the display module 100.

Here, since the fixing unit 220 is provided with the anti-buckling unit 230, when the fixing unit 220 moves along the guide holes 224, the central portion of the fixing unit 220 may be pressed in the direction of the display module 100 by means of the anti-buckling unit 230. Due to this pressing force, not only the distal end of the fixing unit 220 but also the central portion of the fixing unit 220 may further press the display module 100. Thus, deformations in the display module 100 caused by external vibrations or heat expansion may be minimized or at least reduced so that the display module 100 may be used more reliably.

FIGS. 17A to 17D are diagrams schematically illustrating the states of the display module according to changes in the position of the pressing member 223 in FIG. 16. Although the pressing member 223 and the display module 100 are illustrated as interfering with each other for convenience of description in embodiments, the pressing member 223 and the display module 100 may be deformed by an amount equal to a distance that the pressing member 223 has been displaced.

Figure 17A:
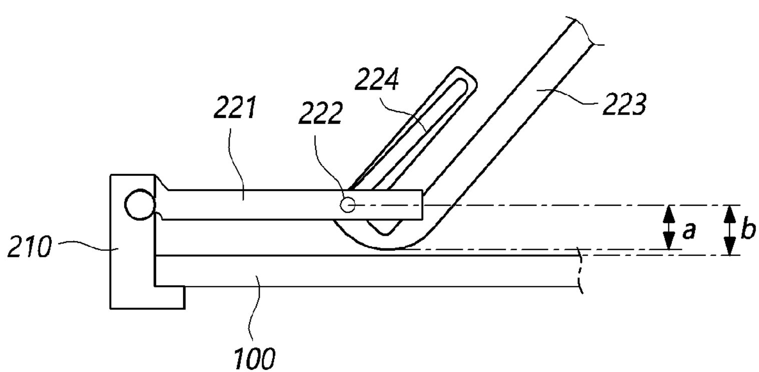
FIGS. 17A to 17D are diagrams schematically illustrating the states of the display module according to changes in the position of the pressing member in FIG. 16 according to embodiments.

As illustrated in FIG. 17A, before the pressing member 223 presses the display module 100, the distance 'a' between the axis of rotation and the pressing member 223 is smaller than the distance 'b' between the axis of rotation and the display module 100, i.e., a<b.

Figure 17B:
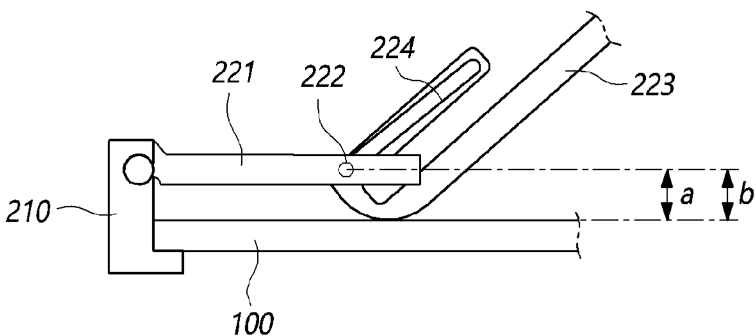

In addition, as illustrated in FIG. 17B, at a point at which the pressing member 223 is in contact with the display module 100 during rotation, the distance 'a' and the distance 'b' are the same, i.e., a=b.

Figure 17C:
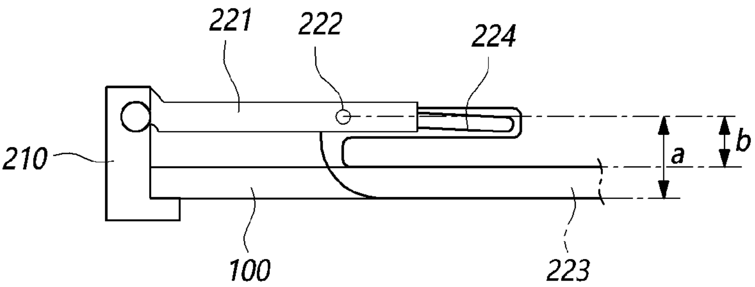
Figure 17D:
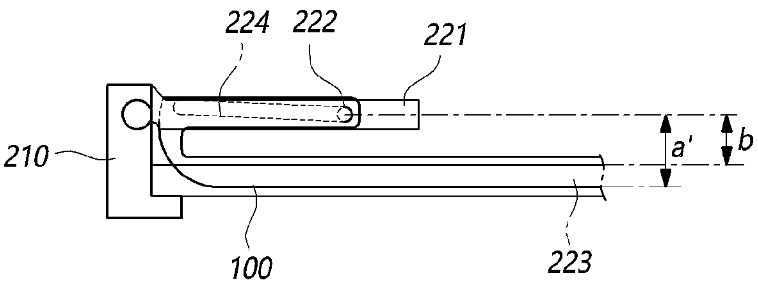

Afterwards, as illustrated in FIG. 17C, the rotation of the pressing member 223 is completed and thus the display module 100 is pressed, the distance 'a' is greater than the distance 'b', i.e., a>b. In this state, when the pressing member 223 is moved toward the side frame 210 along the guide holes 224, the pressing member 223 moves upwards along the inclination of the guide holes 224 from the right to the left in the figure as illustrated in FIG. 17D. When the distance between the axis of rotation and the pressing member 223 is 'a'', a relationship a'>b is obtained. In this case, the pressing member 223 may not be forcibly moved upwards. When the pressing member 223 is forced to move upwards, the display module 100 or the side frame 210 may be plastically deformed or damaged.

In addition, the distance 'a' between the axis of rotation and the pressing member 223 before the movement along the guide holes 224 and the distance 'a'' between the axis of rotation and the pressing member 223 after the movement along the guide holes 224 have a relationship a>a'.

Thus, although the pressure in the ultimately pressed state is lower than the pressure in the initially pressed state, restoration to the initially pressed state may not be realized without applying an amount of pressure equal to or greater than the difference in the frictional force and height between the pressing member 223 and the display module 100, due to the difference of height corresponding to the distance difference a-a'. Accordingly, unless excessive force is intentionally applied to the pressing member 223, the pressing member 223 may not be easily restored to the original position due to only a reason such as external vibrations or thermal expansion, thereby being reliably fixed.

The above-described embodiments of the present disclosure will be briefly reviewed as follows.

Embodiments may provide a display device including: a display module; a side frame supporting a portion of each of side portions of the display module; and at least one fixing unit fixing the display module to the side frame by pressing one surface of the display module on the side frame.

According to embodiments, in a state in which the display module is coupled to the side frame, the fixing unit may move toward the side frame along an upward incline on the display module to press one surface of the display module.

According to embodiments, the display module may include: an organic light-emitting display panel; and at least one of a back cover covering one surface of the organic light-emitting display panel and a heat dissipation plate located between the organic light-emitting display panel and the back cover.

According to embodiments, the fixing may be configured to be rotatable or movable linearly on the side frame, and the side frame may include an anti-rotation portion to constrain rotation of the fixing unit according to a moved position.

According to embodiments, the anti-rotation portion may have a tapered shape protruding from the side frame toward the display module to support a portion of one surface of the display module, with a protruding end thereof being inclined downward toward the display module.

According to embodiments, the fixing unit may include: a holder frame coupled to the side frame and having a through-hole extending in a longitudinal direction; a holder rod coupled to the through-hole of the holder frame; and a pressing member having a guide hole extending through a side portion to be elongated from the side frame toward the display module, wherein the pressing member is movably coupled to the holder frame by means of the holder rod inserted into the guide hole to press one surface of the display module.

According to embodiments, the guide hole may be inclined downward from the side frame toward the display module.

According to embodiments, when the pressing member moves toward the side frame along the guide hole in a state in which the display module is coupled to the side frame, a distal end of the pressing member may press one surface of the display module so that the display module is fixed between the side frame and the pressing member.

According to embodiments, the holder frame may include: a rod coupled to a longitudinal rail groove of the side frame so as to be rotatable and movable; a plurality of extension plates extending from side portions of the rod in one direction and spaced apart from each other; and a plurality of constraining plates respectively protruding from one surface of a corresponding extension plate of the plurality of extension plates adjacent to the rod away from the display module, wherein each of the plurality of constraining plates interferes with a portion of the side frame depending on a rotation or movement state of the rod so as to constrain rotation of the rod.

According to embodiments, the pressing member may include: a coupling portion having the guide hole in a side portion thereof and coupled to the holder rod through the guide hole; an extension portion extending from one end of the coupling portion toward the display module; and a pressing plate extending perpendicularly from an extended end of the extension portion to selectively press the display module in response to changes in position.

According to embodiments, the display device may further include an anti-buckling unit pressing a central portion of the fixing unit toward the display module so that the central portion of the fixing unit presses the display module.

According to embodiments, the anti-buckling unit may include: a guide link hinge-coupled to the central portion of the fixing unit; an elastic member disposed to face the guide link on the fixing unit, wherein the elastic member moves toward the display module when external force is applied and returns to an original position when external force is removed; a backup member elastically supporting the other side of the guide link on the elastic member; a locking member configured such that one side thereof is rotatable with respect to the side frame and a portion of the other side thereof is supported on the guide link; and a holder provided on one surface of the fixing unit, wherein when the fixing unit is moving toward the side frame in order to press one surface of the display module, the holder constrains the other side of the locking member.

According to embodiments, the elastic member may be provided by cutting a portion of the fixing unit into the shape of a plate having a free end facing the guide link and a fixed end located at the other side of the free end.

According to embodiments, the elastic member may be configured such that the thickness thereof gradually decreases from the fixed end to the free end.

According to embodiments, the backup member may include: a fixed plate fixed to one surface of the elastic member and extending from the guide link toward the holder; a perpendicular plate extending perpendicularly from the extended end of the fixing unit; and a support plate extending perpendicularly from the extended end of the perpendicular plate and disposed to face the fixed plate to support a portion of the guide link.

According to embodiments, the holder may include: a first protruding portion protruding perpendicularly from one surface of the other side of the fixing unit; and a second protruding portion protruding from the protruding end of the first protruding portion toward the locking member.

According to embodiments, the protruding length of the first protruding portion may be greater than the thickness of the locking member and be smaller than a sum of the thicknesses of the guide link, the backup member, and the locking member.

Embodiments may provide a fixing device of a display module, the fixing device including: a side frame supporting a portion of each of side portions of a display module; and at least one fixing unit fixing the display module to the side frame by pressing one surface of the display module on the side frame.

According to embodiments, in a state in which the display module is coupled to the side frame, the fixing unit may move along an upward incline on the display module toward the side frame to press one surface of the display module.

According to embodiments, the fixing device may further include an anti-buckling unit pressing a central portion of the fixing unit toward the display module so that the central portion of the fixing unit presses the display module.

According to embodiments, the adhesive material for attaching respective components of the display module may be omitted. Thus, the problem of peeling of the adhesive material due to high-temperature heat generated during operation of the display module may be overcome, thereby improving the reliability of a product. In addition, the heat dissipation plate may be brought into direct contact with the organic light-emitting display panel of the display module, whereby heat dissipation efficiency may be improved.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention.

What is claimed is:

1. A display device comprising:

a display module comprising side portions;

a side frame supporting a portion of each of the side portions of the display module; and at least one fixing unit configured to fix the display module to the side frame, the at least one fixing unit pressing a surface of the display module on the side frame, wherein the at least one fixing unit is configured to be rotatable or movable linearly on the side frame, and wherein the side frame comprises an anti-rotation portion to constrain rotation of the at least one fixing unit according to a moved position.

2. The display device according to claim 1, wherein while the display module is coupled to the side frame, the at least one fixing unit is configured to move toward the side frame along an upward incline on the display module such that the at least one fixing unit presses the surface of the display module.

3. The display device according to claim 1, wherein the display module comprises:

an organic light-emitting display panel; and at least one of a back cover covering a surface of the organic light-emitting display panel and a heat dissipation plate between the organic light-emitting display panel and the back cover.

4. The display device according to claim 1, wherein the anti-rotation portion has a tapered shape protruding from the side frame toward the display module to support a portion of the surface of the display module, a protruding end of the anti-rotation portion being inclined downward toward the display module.

5. The display device according to claim 1, wherein the at least one fixing unit comprises:

a holder frame coupled to the side frame, the holder frame having a through-hole extending in a longitudinal direction;

a holder rod coupled to the through-hole of the holder frame; and a pressing member having a guide hole extending through a side portion to be elongated from the side frame toward the display module, wherein the pressing member is movably coupled to the holder frame by inserting the holder rod into the guide hole to press the surface of the display module.

6. The display device according to claim 5, wherein the guide hole is inclined downward from the side frame toward the display module.

7. The display device according to claim 6, wherein the pressing member is configured to move toward the side frame along the guide hole while the display module is coupled to the side frame and a distal end of the pressing member presses the surface of the display module such that the display module is fixed between the side frame and the pressing member.

8. The display device according to claim 5, wherein the holder frame comprises:

a rod coupled to a longitudinal rail groove of the side frame, the rod configured to be rotatable and movable;

a plurality of extension plates extending from side portions of the rod in one direction and spaced apart from each other; and a plurality of constraining plates respectively protruding from a surface of a corresponding extension plate of the plurality of extension plates adjacent to the rod away from the display module, wherein each of the plurality of constraining plates interferes with a portion of the side frame depending on a rotation or movement state of the rod so as to constrain rotation of the rod.

9. The display device according to claim 5, wherein the pressing member comprises:

a coupling portion having the guide hole in a side portion of the coupling portion, the coupling portion coupled to the holder rod through the guide hole;

an extension portion extending from an end of the coupling portion toward the display module; and a pressing plate extending perpendicularly from an extended end of the extension portion to selectively press the display module in response to changes in position.

10. The display device according to claim 1, further comprising:

an anti-buckling unit pressing a central portion of the at least one fixing unit toward the display module causing the central portion of the at least one fixing unit to press the display module.

11. The display device according to claim 10, wherein the anti-buckling unit comprises:

a guide link hinge-coupled to the central portion of the at least one fixing unit;

an elastic member facing the guide link on the at least one fixing unit, wherein the elastic member is configured to move toward the display module responsive to an external force applied to the elastic member, and return to an original position responsive to the external force being removed;

a backup member elastically supporting a side of the guide link on the elastic member;

a locking member configured such that a first side of the locking member is rotatable with respect to the side frame and a portion of a second side of the locking member is supported on the guide link; and a holder on a surface of the at least one fixing unit, wherein the at least one fixing unit is configured to move toward the side frame to press the surface of the display module, causing the holder to constrain the second side of the locking member.

12. The display device according to claim 11, wherein the elastic member is provided by cutting a portion of the at least one fixing unit into a shape of a plate having a free end facing the guide link and a fixed end located at a side of the free end.

13. The display device according to claim 12, wherein a thickness of the elastic member gradually decreases from the fixed end to the free end.

14. The display device according to claim 11, wherein the backup member comprises:

a fixed plate fixed to the surface of the elastic member and extending from the guide link toward the holder;

a perpendicular plate extending perpendicularly from an extended end of the at least one fixing unit; and a support plate extending from the extended end of the perpendicular plate and facing the fixed plate to support a portion of the guide link.

15. The display device according to claim 11, wherein the holder comprises:

a first protruding portion protruding perpendicularly from one surface of a second side of the at least one fixing unit; and a second protruding portion protruding from a protruding end of the first protruding portion toward the locking member.

16. The display device according to claim 15, wherein a protruding length of the first protruding portion is greater than a thickness of the locking member and is smaller than a sum of a thickness of the guide link, a thickness of the backup member, and a thickness of the locking member.

17. A fixing device of a display module, the fixing device comprising:

a side frame supporting a portion of each of side portions of a display module; and at least one fixing unit fixing the display module to the side frame by pressing a surface of the display module on the side frame, wherein the at least one fixing unit is configured to be rotatable or movable linearly on the side frame, and wherein the side frame comprises an anti-rotation portion to constrain rotation of the at least one fixing unit according to a moved position.

18. The fixing device according to claim 17, wherein while the display module is coupled to the side frame, the at least one fixing unit is configured to move along an upward incline on the display module toward the side frame to press the surface of the display module.

19. The fixing device according to claim 17, further comprising:

an anti-buckling unit pressing a central portion of the at least one fixing unit toward the display module causing the central portion of the at least one fixing unit to press the display module.

* * * * *